United States Patent
Dangelo et al.

(10) Patent No.: US 7,538,422 B2
(45) Date of Patent: *May 26, 2009

(54) INTEGRATED CIRCUIT MICRO-COOLER HAVING MULTI-LAYERS OF TUBES OF A CNT ARRAY

(75) Inventors: Carlos Dangelo, Los Gatos, CA (US); Darin Olson, Menlo Park, CA (US)

(73) Assignee: Nanoconduction Inc., Menlo Park, CA (US)

( * ) Notice: Subject to any disclaimer, the term of this patent is extended or adjusted under 35 U.S.C. 154(b) by 138 days.

This patent is subject to a terminal disclaimer.

(21) Appl. No.: 11/532,892

(22) Filed: Sep. 18, 2006

(65) Prior Publication Data

US 2007/0114657 A1    May 24, 2007

Related U.S. Application Data

(63) Continuation-in-part of application No. 10/925,824, filed on Aug. 24, 2004, now Pat. No. 7,109,581.

(60) Provisional application No. 60/497,849, filed on Aug. 25, 2003.

(51) Int. Cl.
*H01L 23/34* (2006.01)
*H05K 7/20* (2006.01)
*H01L 21/00* (2006.01)

(52) U.S. Cl. ............... 257/706; 267/713; 267/717; 267/720; 267/E23.101; 267/E23.105; 361/709; 361/718; 438/122; 977/742; 977/762

(58) Field of Classification Search ............... None
See application file for complete search history.

(56) References Cited

U.S. PATENT DOCUMENTS

| | | | |
|---|---|---|---|
| 4,466,618 A | 8/1984 | Angelini | |
| 4,932,052 A | 6/1990 | Lo | |
| 5,060,543 A | 10/1991 | Warheit | |
| 5,217,094 A | 6/1993 | Walter et al. | |
| 5,713,690 A | 2/1998 | Corbin, Jr. et al. | |

(Continued)

FOREIGN PATENT DOCUMENTS

EP        1329953        8/2003

(Continued)

OTHER PUBLICATIONS

Iijima, et al., "Single-shell carbon nanotubes of 1-nm diameter", Nature 363, 603 (1993).
Baughman et al.; "Carbon Nanotubes—the Route Toward Applications", W A, Science 297, 787 (2002).
Wong, et al.; "Nanobeam Mechanics: Elasticity, Strength, and Toughness of Nanorods and Nanotubes", Science 277, 1971, (1997).

(Continued)

*Primary Examiner*—Alonzo Chambliss
(74) *Attorney, Agent, or Firm*—Williams, Morgan & Amerson, P.C.

(57) ABSTRACT

Heat sink structures employing multi-layers of carbon nanotube or nanowire arrays to reduce the thermal interface resistance between an integrated circuit chip and the heat sink are disclosed. In one embodiment, the nanotubes are cut to essentially the same length over the surface of the structure. Carbon nanotube arrays are combined with a thermally conductive metal filler disposed between the nanotubes. This structure produces a thermal interface with high axial and lateral thermal conductivities.

8 Claims, 9 Drawing Sheets

U.S. PATENT DOCUMENTS

| | | | |
|---|---|---|---|
| 5,808,236 A | 9/1998 | Brezina et al. | |
| 5,818,700 A | 10/1998 | Purinton | |
| 5,837,081 A | 11/1998 | Ting | |
| 5,932,925 A | 8/1999 | McIntyre | |
| 5,965,267 A | 10/1999 | Nolan | |
| 5,990,552 A | 11/1999 | Xie et al. | |
| 6,156,256 A | 12/2000 | Kennel | |
| 6,180,874 B1 | 1/2001 | Brezina et al. | |
| 6,231,744 B1 | 5/2001 | Ying | |
| 6,232,706 B1 | 5/2001 | Dai | |
| 6,359,288 B1 | 3/2002 | Ying | |
| 6,361,861 B2 | 3/2002 | Gao | |
| 6,373,703 B2 | 4/2002 | Johnson et al. | |
| 6,383,923 B1 | 5/2002 | Brown | |
| 6,395,991 B1 | 5/2002 | Dockerty et al. | |
| 6,407,922 B1 | 6/2002 | Eckblad | |
| 6,417,563 B1 | 7/2002 | Halderman et al. | |
| 6,432,740 B1 | 8/2002 | Chen | |
| 6,449,155 B1 | 9/2002 | Colbert et al. | |
| 6,504,292 B1 | 1/2003 | Choi | |
| 6,591,658 B1 | 7/2003 | Yedur | |
| 6,618,251 B2 | 9/2003 | Ishimine | |
| 6,713,151 B1 | 3/2004 | Dean | |
| 6,724,906 B2 | 4/2004 | Naksen et al. | |
| 6,756,026 B2 | 6/2004 | Colbert | |
| 6,800,886 B2 | 10/2004 | Awano | |
| 6,821,415 B2 | 11/2004 | Sharb | |
| RE38,677 E | 12/2004 | Blomquist | |
| 6,853,068 B1 | 2/2005 | Djekic | |
| 6,855,376 B2 | 2/2005 | Hwang | |
| 6,856,016 B2 | 2/2005 | Searls | |
| 6,856,511 B1 | 2/2005 | Viernes et al. | |
| 6,859,367 B2 | 2/2005 | Davison | |
| 6,862,962 B1 | 3/2005 | Delbrugge et al. | |
| 6,864,571 B2 | 3/2005 | Arik | |
| 6,880,799 B2 | 4/2005 | Mrozek | |
| 6,891,724 B2 | 5/2005 | De Lorenzo | |
| 6,892,652 B2 | 5/2005 | Jalbert et al. | |
| 6,900,580 B2 | 5/2005 | Dai et al. | |
| 6,910,666 B2 | 6/2005 | Burr | |
| 6,921,462 B2 | 7/2005 | Montgomery | |
| 6,924,335 B2 | 8/2005 | Fan et al. | |
| 6,955,800 B2 | 10/2005 | Resasco et al. | |
| 6,962,823 B2 | 11/2005 | Empedocles | |
| 6,965,513 B2 | 11/2005 | Montgomery | |
| 6,989,325 B2 | 1/2006 | Uang | |
| 6,998,358 B2 | 2/2006 | French et al. | |
| 7,008,604 B2 | 3/2006 | Smalley | |
| 7,011,771 B2 | 3/2006 | Gao | |
| 7,019,391 B2 * | 3/2006 | Tran | 257/678 |
| 7,029,646 B2 | 4/2006 | Margrave | |
| 7,033,647 B2 | 4/2006 | Tang et al. | |
| 7,052,666 B2 | 5/2006 | Colbert | |
| 7,109,581 B2 * | 9/2006 | Dangelo et al. | 257/720 |
| 7,118,941 B2 * | 10/2006 | Zhang et al. | 438/122 |
| 7,273,095 B2 * | 9/2007 | Li et al. | 165/185 |
| 2002/0090501 A1 | 7/2002 | Tobita | |
| 2002/0100581 A1 | 8/2002 | Knowles | |
| 2002/0130407 A1 | 9/2002 | Dahl | |
| 2002/0145194 A1 | 10/2002 | O'Connor | |
| 2002/0163079 A1 | 11/2002 | Awano | |
| 2003/0111333 A1 | 6/2003 | Montgomery | |
| 2003/0117770 A1 | 6/2003 | Montgomery | |
| 2003/0231471 A1 | 12/2003 | De Lorenzo | |
| 2004/0005736 A1 | 1/2004 | Searls | |
| 2004/0013598 A1 | 1/2004 | McElrath | |
| 2004/0053053 A1 | 3/2004 | Jiang | |
| 2004/0097635 A1 * | 5/2004 | Fan et al. | 524/496 |
| 2004/0101468 A1 | 5/2004 | Liu | |
| 2004/0136161 A1 | 7/2004 | Miyamura et al. | |
| 2004/0146560 A1 | 7/2004 | Whiteford | |
| 2004/0150100 A1 | 8/2004 | Dubin et al. | |
| 2004/0152240 A1 | 8/2004 | Dangelo | |
| 2004/0182600 A1 | 9/2004 | Kawabata | |
| 2004/0184241 A1 | 9/2004 | De Lorenzo | |
| 2004/0191158 A1 | 9/2004 | Liu | |
| 2004/0218362 A1 | 11/2004 | Amaro | |
| 2004/0261978 A1 | 12/2004 | Zhan | |
| 2004/0261987 A1 | 12/2004 | Zhang | |
| 2004/0265489 A1 | 12/2004 | Dubin | |
| 2004/0266063 A1 | 12/2004 | Montgomery | |
| 2004/0266065 A1 | 12/2004 | Zhang | |
| 2005/0006754 A1 | 1/2005 | Arik | |
| 2005/0037204 A1 | 2/2005 | Osiander | |
| 2005/0061496 A1 | 3/2005 | Matabayas | |
| 2005/0067693 A1 | 3/2005 | Nihei | |
| 2005/0092464 A1 | 5/2005 | Leu | |
| 2005/0116336 A1 | 6/2005 | Chopra | |
| 2005/0136248 A1 | 6/2005 | Leu | |
| 2005/0139642 A1 | 6/2005 | Koning | |
| 2005/0139991 A1 | 6/2005 | White | |
| 2005/0150887 A1 | 7/2005 | Taya | |
| 2005/0167647 A1 | 8/2005 | Huang | |
| 2005/0224220 A1 | 10/2005 | Li | |
| 2005/0238810 A1 | 10/2005 | Scaringe | |
| 2005/0260412 A1 | 11/2005 | Gardner | |
| 2005/0269726 A1 | 12/2005 | Matabayas, Jr. | |

FOREIGN PATENT DOCUMENTS

| | | |
|---|---|---|
| WO | WO03/054958 | 7/2003 |
| WO | WO03/072679 | 9/2003 |
| WO | WO03/107419 | 12/2003 |

OTHER PUBLICATIONS

Yu, et al.; Tensile Loading of Ropes of Single Wall Carbon Nanotubes and their Mechanical Properties', Phys. Rev. Lett. 84 5552 (2000).

Odom, et al.; "Atomic structure and electronic properties of single-walled carbon nanotubes", Nature 391, 62 (1998).

Wildoer, et al.; "Electronic structure of Atomically resolved carbon nanotubes", Nature, 391, 59(1998).

Li, et al.; "Bottom-up approach for carbon nanotube interconnects", Appl. Phys. Lett., 82, 2491 (2003).

Baugham, et al.; "Carbon Nanotube Acutators", Science 284, 1340 (1999).

Star. et al; "Nano Optoelectronic Memory Devices", Nano Lett. 4, 1587 (2004).

Lee, et al.; "Bandgap Modulation of Carbon Nanotubes by Encapsulated Metallofullerenes", pp. 1005-1008.

Collins, et al.; "Engineering Carbon Nanotubes and Nanotube Circuits Using Electrical Breakdown", Science 292, 706 (2001).

Bachtold, et al.; "Logic Circuits with Carbon Nanotube Transistors", Science 294, 1317 (2001).

Koehne, et al.; "Ultrasensitve label-free DNA analysis using an electronic chip based on carbon nanotube nanoelectrode arrays", Nanotechnology, 14, 1239 (2003).

Kong, et al,; "Nanotube Modecular Wires as Chemical Sensors", Science 287, 622 (2000).

Li et al.; "Carbon Nanotube Sensors for Gas and Organic Vapor Detection", Nano Lett. 3, 929 (2003).

Novak, et al.; "Nerve agent detection using networks of single-walled carbon nanotubes", Appl. Phys. Lett. 83, 4026 (2003).

Ruoff, et al.; "Mechanical and Thermal Properties of Carbon Nanotubes", Carbon 33, 925 (1995).

Fujii, et al.; "Measuring the Thermal Conductivity of a Single Carbon Nanotube", Phys. Rev. Lett. 95, 065502 (2005).

Kim, et al.; "Thermal Transport Measurements of Individual Multiwalled Nanotubes", Phys. Rev. Lett.87 215502 (2001).

Pop, et al,; "Thermal Conductance of Individual Single-Wall Carbon Nanotube above Room Temperature", Nano Lett. 6, 96 (2006).

Xu, et al.; "Enhancement of Thermal Interface Materials with Carbon Nanotube Arrays," International Journal of Heat and Mass Transfer, vol. 49, pp. 1658-1666, (2006).

Yu, et al.; "Thermal Contact Resistance and Thermal Conductivity of a Carbon Nanofiber", *J. Heat. Tran.* 2006, 128, 234.

Wang, et al.; "Photo-Acoustic Measurement of Thermal Conductivity of Thin Films and Bulk Materials", ASME, J. Heat Transfer, 123, 138 (2001).

Dresselhaus, et al.;"Raman spectroscopy on one isolated carbon nanotube", Physica B. 232, 15 (2002).

Dresselhaus, et al.; "Phonons in carbon nanotubes", Adv. Phys. 49, 705 (2000).

Markutsya, et al.; "Freely Suspended Layer-by-layer Nanomembranes: Testing Micrormechanical Properties", pp. 771-780, (2005).

Brown, et al.; "Anti-Strokes Raman spectra of single-walled carbon nanotubes", Phys. Rev. B. 61, 5137 (2000).

Jorio, et al.; "Structural (n,m) Determination of Isolated Single-Wall Carbon Nanotubes by Resonant Raman Scattering", Phys. Rev. Lett. 86, 1118 (2001).

Sullivan, et al.;"An Experimental and Theoretical Study of Transient Negative Ions in Mg, Zn, Cd, and Hg", pp. 159.1-159.26, (2003).

Popov, et al.; "Carbon nanotubes: properties and application", Mat. Sci. Eng. R, 43, 61, (2004).

Bachtold, et al.; "Contacting carbon nanotubes selectively with low-ohmic contacts for four-probe electric measurements", Appl. Phys. Lett. 73, 274, (1998).

Zhang, et al.; "Heterostructures of Single-Walled Carbon Nanotubes and Carbide Nanorods", Science, 285, 1719 (1999).

Lee, et al.; "Formation of low-resistance ohmic contacts between carbon nanotube and metal electrodes by a rapid thermal annealing method", J. Phys. D. Appl. Phys., 33, 1953 (2000).

Terekhov, et al.; "Laser heating method for estimation of carbon annotube purity", Appl. Phys. A, 74, 393 (2002).

Terekhov, et al.; "Calibration of Raman-Based Method for Estimation of Carbon Nanotube Purity", AIP Proc. 685, 116 (2003).

E. Suhir, "Bimateral assembly with a low modulus bonding layer at the ends", Journal of Applied Physics, 93, 3657, (2003).

Treacy, et al.; "Exceptionally high Young's modulus observed for individual carbon nanotubes", Lett Nature, 381, 678, (1996).

Yao, et al.;"Young's Modulus of Single Walled Carbon Nanotubes", J. Appl. Phys., 84(4):1939-1943, (1998).

Hernandez, et al.; "Elastic Properties of c and bxcynz Composite Nanotudes", Phys. Rev. Lett., 80(20):4502-4505, (1998).

Krishnan, et al.; "Young's Modulus of Single Walled Nanotubes", Phys. Rev. B. 58(20):14013-14019, (1998).

Poncharal, et al.; "Electrostatic Deflections and Electromechanical Resonances of Carbon Nanotubes", Science, 283, 1513 (1999).

Gaillard et al.; 2005, "Mechanical properties of chemical vapor deposition-grown multiwalled carbon nanotubes", Applied Physics Letters, vol. 86, No. 23 (2005).

Wei, et al.; 2004, "Nanomechanics of carbon nanofibers: structural and elastic properties", Applied Physics Letters, vol. 85, No. 12, pp. 2208-2210 (2004).

Salvetat, et al.; "Elastic Modulus of Ordered and Disordered Multi-Walled Carbon Nanotubes", Adv. Mater. 11(2):161-165, (1999).

Cao, et al.; "Super compressible foam like carbon nanotube films", Science, 310, 1307 (2005).

Xin, et al.; "Strain Energy and Young's Modulus of Single-Wall Carbon Nanotubes Calculated From Electronic Energy-Band Theory", Phys. Rev., B, 62(20):13692-13696, (2000).

Ru, C.Q., "Effective Bending Stiffness of Carbon Nanotubes", Phys. Rev. B. 62(15):9973-9976, (2000).

Yu et. al., "Strength and Breaking Mechanism of Multiwalled Carbon Nanotubes Under Tensile Load", Science, 287, 637 (2000).

Kuzumaki et. al., "Dynamic measurement of electrical conductivity of carbon nanotubes during mechanical deformation by nanoprobe manipulation in transmission electron microscopy", Appl. Phys. Lett. 85, 1250 (2004).

Nishio, et. al.; "Buckling Test under Axial Compression for Multiwall Carbon Nanotubes", Jpn. J. Appl. Phys. 44, L1097 (2005).

Govindjee, et al.; "On the Use of Continuum Mechanics to Estimate the Properties of Nanotubes", Solid State Comm., 110(4):227-230, (1999).

Harik, V.M.; "Ranges of Applicability for the Continuum Beam Model in the Mechanics of Carbon Nano-Tubes and Nano-Rods", Solid State Comm, 120(331-335), (2001).

Lourie, et al.; "Buckling and Collapse of Embedded Carbon Nanotubes", Phys. Rev. Letters, 81(8): 1638-1641, (1988).

Falvo, et al; "Bending and Buckling of Carbon Nanotubes Under Large Strain", Nature, 389 (6651): 582-584, (1997).

Ru, C.Q.; "Effect of van der Waals Forces an Axial Buckling of a Double-Walled Carbon Nanotube", J.Appl.Phys., 87(10):7227-7231, (2000).

Ru, C.Q.; "Column Buckling of Multi-Walled Carbon Nanotubes with Interlayer Radial Displacements", Phys. Rev., B, 62(24):16962-16967, (2000).

Ru, C.Q.; "Degraded Axial Buckling Strain on Multi-Walled Carbon Nanotibes due to Interlayer Slips", J. Appl. Physics, 89(6):3426-3433, (2001).

Wang, et. al,;"Axially Compressed Buckling of Pressured Multiwall Carbon Nanotubes", pp. 3893-3911, (2002).

Ru, C.Q.; "Elastic Buckling of Sinlge Walled Carbon Nanotube Ropes Under High Pressure", Phys. Rev., B. 62(15):10405-10408, (2000).

Cruden, et al.; "Reactor design considerations in the hot filament/direct current plasma synthesis of carbon nanofibers", J. Appl. Phys., 94, 4070, (2003).

Li, et al.; "Electronic properties of multiwalled carbon nanotubes in an embedded vertical array", Appl. Phys. Lett. 2002, 81, 910 (2002).

Cui, et al.;"Growth of Carbon Nanofibers on Tipless Cantilevers for High Resolution Topography and Magnetic Force Imaging", Nano Lett. 4, 2157 (2004).

Chen, et al.; "Extremely Sharp carbon nanocone probes for atomic force microscopy imaging", Appl. Phys. Lett. 88, 153102 (2006).

E. Suhir, "Analysis of Interfacial Thermal Stresses in a Tri-Material Assembly", Journal of Applied Physics, 89, 3685 (2001).

Banerjee, K. et al. "3-D Heterogeneous ICs: a Technololgy for the Next Decade and Beyond." 5th IEEE Workshop on Signal propagation on Interconnects, Venice, Italy, May 13-15, 2001.

Berber et al. "Unusually High Thermal Conductivity of Carbon Nanotubes, Physical Review Letters." May 15, 2000, pp. 4613-4616, vol. 84, No. 20.

Cassell, a. "Direct Growth of Free-standing single-Walled Carbon Nanotubes." J. Am. Chemical society, 1999, 121, pp. 7975-7976.

Chiang, T.Y. "A New Analytical Thermal Model for Multilevel ULSI Interconnects Incorporating Via Effect." Center for Integrated Systems, Stanford University.

Chiang, T.Y. "Effect of Via Separation and Low-k Dielectric Materials on the Thermal Characteristics of Cu Interconnects." IEDM 2000.

Cui, Y. et al. "Doping and Electrical Transport in Silicon Nanowaves." Journal of Physical Chemistry, vol. 104, No. 22, Jun. 8, 2000, pp. 5213-5216.

de Pablo, P.J. "A Simple, Reliable Technique for Making Electrical Contact to Multiwalled Carbon Nanotubes," Applied Physics Letters, vol. 74, No. 2, Jan. 11, 1999, pp. 323-325.

Delzeit, L. et al. "Growth of Carbon Nanotubes by Thermal and Plasma Chemical Vapour Deposition Processes and Applications in Microscopy." Nanotechnology, vol. 13, May 23, 2002, pp. 280-284.

Delzeit, L. et al. "Growth of Multiwall Carbon Nanotubes in an Inductively Coupled Plasma Reactor." Journal of Applied Physics, vol. 91, No. 9, May 1, 2002, pp. 6027-6033.

Goodson, K.E. et al. "Improved Heat Sinking for Laser-Diode Arrays Using Microchannels in CBD Diamond." IEE Transactions on Components, Packaging, and Manufacturing Technology, Part B, Advanced Packaging, vol. 20, Issue 1, Feb. 1997, pp. 104-109.

Hone, J. et al. "Thermoelectric Power of Single-Walled Carbon Nanotubes." Physical Review Letters, vol. 80, No.5, Feb. 2, 1998, pp. 1042-1045.

Huang, Z.P. et al. "Growth of Highly Oriented Carbon Nanotubes by Plasma-Enchanced Hot Filament Chemical Vapor Deposition." Applied Physics Letters, vol. 73, No. 26, Dec. 28, 1998, pp. 3845-3847.

International Semiconductor Road Map (ITRS-2001), Section on Interconnect, http://public/itrs.net/files/2001ITRS/interconnect.pdf.

Kim, M.J. et al. "Growth Characteristics of Carbon Nanotubes via Aluminum Nanopore Template on Si Substrate Using PECVD." Elsevier Thin Solid Films, vol. 425, 2003, pp. 312-317.

Kong, J. et al. "Synthesis of Individual Single-Walled Carbon Nanotubes on Patterned Silicon Wafers." Nature, vol. 395, Oct. 29, 1998, pp. 878-881.

Kurabayashi, K. et al. "Precision Measurement and Mapping of die-attach Termal Resistance." IEEE Transactions on Components, Packaging, and Manufacturing Technology, Part A: Advanced Packaging, vol. 21, Issue 3, Sep. 1998, pp. 506-514.

Li, J. et al. "Bottom Up Approach for Carbon Nanotube Interconnects." Applied Phys. Letters, American Institute of Physics, Apr. 18, 2003, pp. 2491-2493, vol. 82, No. 15.

Li, J. et al. "Controlled Deposition of Individual Single-Walled Carbon Nanotubes on Chemically Functionalized Templates." Chemical Physical Letters, 303, Apr. 2, 1999, pp. 125-129.

Li, J. et al. "Electronic Properties of Multiwalled Carbon Nanotubes in an Embedded Vertical Array." Applied Physics Letters, vol. 81, No.I 5, Jul. 29, 2002, pp. 910-912.

McEuen, P.L. et al. "Single-walled Carbon Nanotube Electronics." IEEE Transactions on Nanotechnology, vol. 1, No. 1, Mar. 2002, pp. 78-85.

Meyyappan, M. et al. "Carbon Nanotube Growth by PECVD: a Review," Plasma Sources Science and Technology, vol. 12, April 2, 2003, pp. 205-216.

Ren, Z.F., et al., "Synthesis of Large Arrays of Well-Algned Carbon Nanotubes on Glass." Science, vol. 282, Nov. 6, 1998, pp. 1105-1107.

Shi, L. "A Microdevice for Measuring Thermophysical Properties of Nanowires and Nanotubes." 2001 ASME International Mechanical Engineering Congress and Exposition, Nov. 11-16, 2001, pp. 359-362.

Shi, L. "Scanning Thermal Microscopy of Carbon Nanotubes Using Batch-Fabricated Probes." Applied Physics Letters, vol. 77, No. 26, Dec. 25, 2000. pp. 4295-4297.

Stevens, R. "Improved Fabrication Approach for Carbon Nanotube Probe Devices," Applied Physics Letters, vol. 77, No. 21, Nov. 20, 2000, pp. 3453-3455.

Sun, X. et al. "Theoretical Modeling of Thermoelectricity in Bi Nanowires." Applied Physcis Letters, vol. 74, No. 26, Jan. 28, 1999, pp. 4005-4007.

Tu et al. "Growth of Aligned Carbon Nanotubes with Controlled Site Density," Applied Phys. Letters, American Institute of Physics, May 27, 2002, pp. 4018-4020, vol. 80, No. 21.

Yakobson, B.I. et al. "Fullerene Nanotubes: $C_{1,000,000}$ and Beyond." American Scientist online, http://www.americanscientist.org/template/AssetDetail/assetid/2870?fulltext=true&print=yes.

Zhang, "Formation of Metal Nanowires on Suspended Single-Walled Carbon Nanotubes." Appl. Phys. Lett., vol. 77(19), p. 3015 (2000.

Zhang, W.D. et al. "Synthesis of Vertically Aligned Carbon Nanotubes Films on Silicon Wafers by Pyrolysis of Ethylenediamine." Elsevier, Thin Solid Films, 422, 2002, pp. 120-125.

Zhang, Y. et al. "Electric-Field-Directed Growth of Aligned single-Walled Carbon Nanotubes." Applied Physics Letters, vol. 79, No. 19, Nov. 5, 2001, pp. 3155-3157.

Zhou, P. et al. "Thermomechanical diagnostics of FLIP-CHIP/BGA Structures Using Phase-Shifting Electronic Speckle Pattern Interferometry." EEP, Advances in Electronic Packaging, vol. 26-2, ASME, 1999, pp. 1875-1880.

* cited by examiner

Figures

INTEGRATED CIRCUIT MICRO-COOLER HAVING MULTI-LAYERS OF TUBES OF A CNT ARRAY

CROSS REFERENCE TO RELATED APPLICATIONS

This application is a continuation-in-part of U.S. patent application Ser. No. 10/925,824 filed Aug. 24, 2004 now U.S. Pat. No. 7,109,581, which claims priority from U.S. provisional patent application Ser. No. 60/497,849, filed on Aug. 25, 2003. The application is related to U.S. patent applications entitled "An Integrated Circuit Micro-Cooler with the Tubes of a CNT Array in Essentially the Same Height Over a Surface and Methods Thereof" and "An Integrated Circuit Micro-Cooler with Double-Sided Tubes of a CNT Array and Methods Thereof", both assigned to common assignee.

BACKGROUND OF THE INVENTION

1. Technical Field

The invention relates to the removal of heat generated by an integrated circuit and the components used in chip assembly and packaging to facilitate said heat removal. More specifically, the invention discloses the application of self-assembled nano-structures for improving the performance of heat sink structures coupled to integrated circuit devices, and more specifically to a method for creating a heat sink structure consisting of multiple layers of carbon nanotubes.

2. Discussion of the Prior Art

Prior art techniques that are used to cool semiconductor ICs incorporate the use of large and expensive chip packaging having externally mounted, finned heat sinks coupled to the ceramic or plastic encapsulated IC chip. As the speed and density of modern integrated circuits increase, the power generated by these chips also increases, often in geometric proportion to increasing density and functionality. In the video processing and CPU application areas, the ability to dissipate the heat being generated by current ICs is becoming a serious limitation in the advance of technology. In the current art, relatively large interface-thermal-resistances are added when the die is attached to a heat spreader, heat pipe, or heat sink. These multiple interfaces have the undesired side effect of increasing total die-to-heat sink resistance and making heat transfer more difficult.

FIG. 1 (prior art) is a cross section schematic view of a simplified integrated circuit structure. A transistor structure 102 is formed near the top surface of a substrate 100. Electrical interconnects 106 are used to make contact with the transistor 102 and numerous other similar devices (not shown) on the substrate 100. Solder balls 104 are used to complete the interconnect of the integrated circuit to a printed circuit board or wire leadframe. This type of package is often referred to as a flip chip device. In the current art, heat generated by the transistor 102 is extracted through the substrate 100 to the back surface of the chip. A heat transfer bonding layer 108 may be used to enhance heat conduction by reducing interfacial heat transfer resistance created by air gaps and surface irregularities. Typically, this layer may be composed of a thermal grease or thermally conductive epoxy. These materials, while better than solid surface/surface contact, still have a relatively poor thermal conductivity when compared to solid metals. As a result, the backside chip surface interface still presents a significant thermal resistance, which limits the power that can be extracted from the chip.

U.S. patent application publication number US2003/0117770 discloses a process of forming a thermal interface that employs carbon nano-tubes to reduce thermal resistance between an electronic device and a heat sink. Bundles of aligned nano-tubes receive injected polymeric material in molten form to produce a composite which is placed between the electronic device and the heat sink. The nano-tubes are aligned parallel to the direction of heat energy. However, the polymeric filler does little to spread heat laterally, potentially creating localized hot spots on the device surface. The use of bundles of aligned carbon nano-tubes may result in reduced thermal conduction as well. Theoretical molecular dynamics simulations have shown that isolated carbon nano-tubes exhibit unusually high thermal conductivity, but that the thermal conductivity degrades by an order of magnitude when carbon nano-tube bundles are formed with tube-to-tube contacts (see for example Savas Berber et al, Physics Review Letters, 84, no. 20, 4613 (May 2000)).

U.S. patent application publication number US2003/0231471 discloses an integrated circuit package that uses single wall or double wall carbon nano-tube arrays grown subsequent to the deposition of CVD diamond films. Due to the roughness of CVD diamond films, carbon nano-tubes are used to aid in making thermal contact between the surfaces of the circuit silicon die and of the integrated heat spreader. The interstitial voids between the nano-tubes are not filled to maintain flexibility. The '471 disclosure, however, fails to provide any method to reduce matting and nano-tube to nano-tube contact, which reduces the effective thermal conductivity of the structure. Although CVD diamond films are good conductors, they may not be thermally compatible, from an expansion perspective, with a number of other metallic materials used in various heat sink structures. Additionally, commonly known techniques for growing carbon nano-tubes preclude carbon nanotube deposition directly on a silicon circuit die because these techniques require temperatures in the range of 700 to 800° C. Exposing a completed circuit die to these elevated temperatures is not a recommended practice.

Effective growth of carbon nano-tubes is limited in length for various practical reasons. Therefore, due to the limitations of prior art solutions it would be advantageous to provide a heat conductor using carbon nano-tubes that are sufficiently long to remove the heat from a hot surface by a desired distance which is larger than the typical distance of a single growth carbon nano-tubes. What is needed is a method and structure by which interface resistances are minimized by integrating several thermal components to maximize heat transfer from hot surfaces on the integrated circuit.

SUMMARY OF THE INVENTION

The invention provides a micro-cooler device structure containing a heat sink body having a heat sink surface and a plurality of individually separated, rod-like nano-structures for transferring thermal energy from a surface of at least one integrated circuit chip to the heat sink surface. The plurality of individually separated, rod-like nano-structures are disposed between the heat sink surface and the heat generating surface. A thermally conductive material is disposed within interstitial voids between the rod-like nano-structures.

In one embodiment of the invention, a method for fabricating a micro-cooler device includes fashioning a shallow cavity in a mounting surface of a heat sink body, growing multiple layers of rod-like nano-structures within the shallow cavity, and depositing a thermally conductive material in interstitial voids between the rod-like nano-structures. Another embodiment of the invention provides for a protrusion of the edges or ends of the rod-like nano-structures at an essentially identical length over a surface of the micro-cooler.

DETAILED DESCRIPTION OF THE INVENTION

Figure 1:
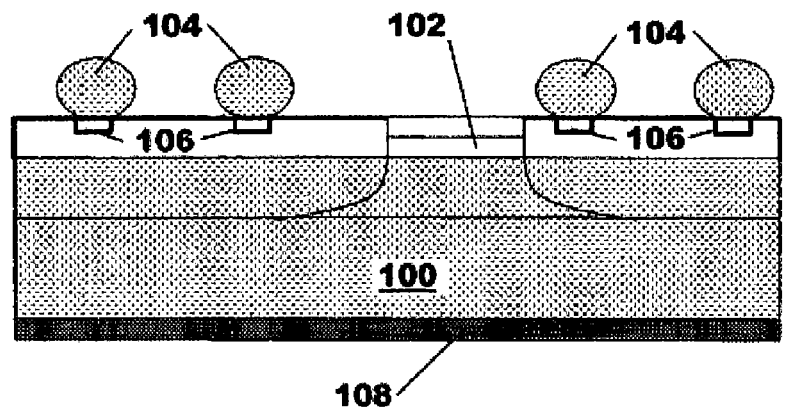
FIG. 1 (prior art) is a cross section schematic view of an integrated circuit structure.
Figure 2:
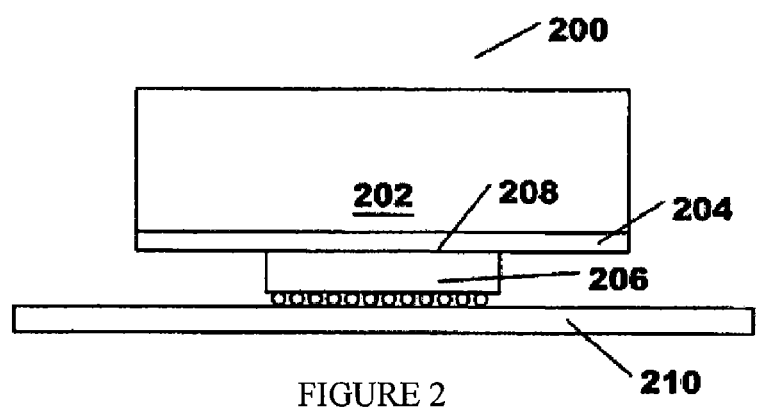
FIG. 2 is a schematic side view of integrated micro-cooler device attached to a flip chip integrated circuit according to the invention.

FIG. 2 is a schematic side view 200 of integrated micro-cooler device 202 attached to a flip chip integrated circuit 206 according to an embodiment of the invention. The integrated micro-cooler device 202 is a separate structure from the chip 206 that contains highly conductive, self-assembled nano structures that are integrated with heat sinking devices. It provides a low thermal resistance path for heat transferred from a surface 208 of the integrated circuit chip 206 mounted on a circuit board 210 below the thermal interface layer 204 provides a low resistance interface that contains nano-structures which enhance heat conduction from the chip 206, reduce the impact of local hot spots in the chip 206, and laterally conduct heat to a heat sink structure 202 having a greater footprint than that of the chip 206. Structural details of micro-cooler device 202 are disclosed below. The chip 206 and micro-cooler 202 may be bonded together using eutectic layers or thermal bonding adhesives (not shown), as is known to those skilled in the art. Additionally, the micro-cooler device 202, integrated circuit chip 206, and circuit board 210 may be held together with mechanical straps, clips, or holding devices (not shown).

Figure 3:
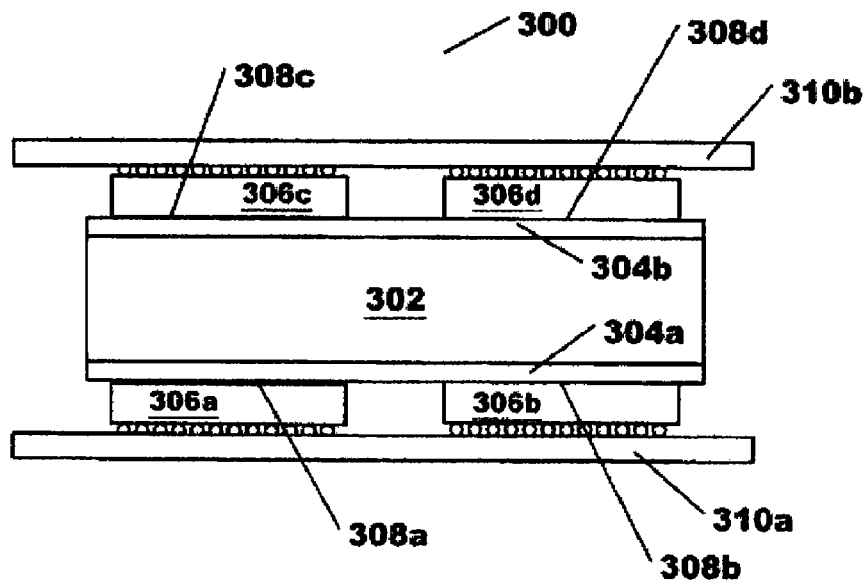
FIG. 3 is a schematic side view of integrated micro-cooler device attached to multiple flip chip integrated circuits according to the invention.

FIG. 3 is a schematic side view 300 of an integrated micro-cooler device 302 attached to multiple flip chip integrated circuits (306a-306d) according to an embodiment of the invention. In this embodiment, both the upper and lower surfaces of the micro-cooler device 302 are used to remove heat energy from the flip chip ICs 306a-306d. Chips 306a and 306b, mounted on a printed circuit board 310a, sink heat from the surfaces 308a and 308b, to device 302 via interface layer 304a. Chips 306c and 306d, mounted on a printed circuit board 310b, sink heat from the surfaces 308c and 308d, to a device 302 via an interface layer 304b. The chips 306 and micro-cooler 302 may be bonded together using eutectic layers or thermal bonding adhesives (not shown), as is known to those skilled in the art. Additionally, the micro-cooler device 302, integrated circuit chips 306, and circuit boards 310 may be held together with mechanical straps, clips, or holding devices (not shown). Although the embodiment shown in FIG. 3 contains four integrated circuits, it should be evident to those of ordinary skill in the art that any number of additional integrated circuit flip chips 306 may be added by increasing the scale of the device 302.

Figure 4:
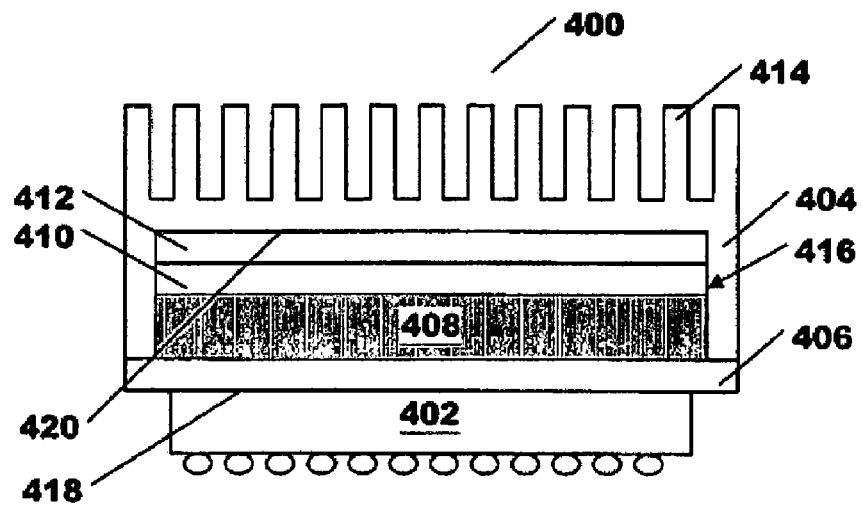
FIG. 4 is a cross section schematic view of a finned integrated micro-cooler device showing the details of construction according to the invention.

FIG. 4 is a cross section schematic view of a finned integrated micro-cooler device 400 showing the details of construction according to an embodiment of the invention. The device 400 comprises a heat sink body 404 for extracting thermal energy from the surface 418 of a flip chip 402. Heat energy is delivered to a heat sink surface 420 by an enhanced heat transfer interface structure containing layers 408, 410, and 412. The heat sink body 404 is fabricated with fins 414 (or pin shaped structures) to enhance heat extraction by convection, which is typically forced air flow generated by a fan or other device. However, natural convection may also be employed if suitable. Also, the fins 414 may be immersed in a liquid, such as water or another liquid phase coolant, for removal of high energy fluxes. The heat sink body 404 may be made from silicon, metals, or heat conductive ceramics. Metals, such as copper or aluminum, are preferred but structures fashioned from silicon substrates, or a metal coated ceramic, may also be used. If silicon is used, the fin surfaces may be coated with a metal to enhance lateral heat conduction. A heat spreading cavity 416 is fashioned within the heat sink body 404, by methods well known to those skilled in the art, to contain heat transfer interface layers 408, 410, and 412.

A layer 408 contains individually separated, rod-like nano-structures that provide very high thermal conductivity to reduce interface contact resistance. These structures may be comprised of metallic nano-wires or, preferably, multi-wall carbon nano-tubes (MWCNT) or multi-wall carbon nanofibers. Metallic nanowires, for example Au, Cu, Ni, zinc oxide, and metal borides, are metal crystals having the shape of a wire with dimensions comparable to the phonon mean free path, usually tens of nanometers at room temperature, to benefit from quantum confinement phenomena, thus allowing for efficient heat transport characteristics and thermal contact. In one example, metal boride nanowires provides good thermal contact resistance because low ohmic contact resistance has been demonstrated with Ni electrodes. Preferably, the MWCNTs are oriented with their longitudinal axis approximately perpendicular to surfaces 420 and 418, parallel to the direction of heat flow. MWCNTs have very high on axis thermal conductivity, generally within the range of 800 to 3000 W/m-° K. TTheir thermal conductivity may be up to a factor of two better than solid CVD diamond films. They are preferably grown on the micro-cooler 400 surface as an array of free standing, vertically aligned, individually separated carbon nanotubes (or nanofibers) that occupy between about 15 and 40% of the surface from which they are grown. In some embodiments, the MWCNT are grown by plasma enhanced CVD (PECVD) growth methods. For example, the methods described by Jun Li et al. (Applied Physics Letters, vol. 81, no. 5 (July 2002) and L. Delzeit et al. (J. Appl. Physics 91, 6027 (May 2002))) can be used. However, while axial thermal conduction of CNTs is very high, lateral thermal conduction in the non-axial direction from nano-tube to nanotube is not as good. In fact, it has been found that lateral contact between axially aligned nano-tubes can reduce their effective axial thermal conductivity. If the number of carbon nano-tubes attached to substrate is too high, for example, >40% CNT density, Van der Waals force create a bundle or mat situation, resulting in poor thermal conduction. If, on the other hand the coverage density is too low, for example, <15%, thermal conduction is also lower due to the reduced number of conducting nano-tubes. A preferred range a coverage density is between about 15 and 40%, with 25% to 40% being most preferred. Thus, as opposed to a bundle or mat of CNTs, vertically aligned, individually separated, parallel CNTs with coverage between about 15 and 40%, can provide better overall thermal conduction.

To improve lateral heat conduction, a thermally conductive material is placed within the interstitial voids between the MWCNTs. The thermally conducting material provides lateral heat conduction within the nano-tube containing layer. Lateral heat conduction facilitates the spreading of heat from a relatively small silicon die surface to the much larger surface area of the heat sink body 404. It also reduces localized hot spots on the surface 418 of the chip 402. The thermally conductive material may be a metal or metal alloy, thermally conductive ceramics, CVD diamond, or thermally conductive polymers. Preferably, the thermally conductive material is a metal, such as copper, aluminum, silver, gold, or their alloys. Of the metal materials, copper and copper alloys are the most preferable. This is generally due to the high thermal conductivity, ease of deposition via electroplating or electrochemical deposition, and low cost. Copper electroplating is well known to those skilled in the art of dual Damascene processing, which is common in the production of modern integrated circuits. Depending on the thermal conductivity of the thermally conductive filler material, the layer 408 is typically between 50 and 1000 microns in thickness.

Another desirable aspect of using metal as a filler material is that it is significantly lower in hardness than the MWCNTs. In some embodiments, planarization of the layer 408 is used to maintain flatness for good long range contact. However, short range surface irregularities on the order of a few microns can also contribute significantly to interface thermal resistance. It is therefore desirable to have some portion of the MWCNTs extend from the bulk of the layer 408, so that the exposed ends may conform to these surface irregularities and improve thermal contact. When the layer 408 is planarized, the softer metal material is eroded more than the harder nanotubes, resulting in an undercutting of the metal layer. This undercutting leaves a portion of the nanotubes extending from the composite layer 408. This undercutting automatically occurs when the layer 408 is planarized with CMP (chemical-mechanical planarization) or electrochemical etching techniques. An additional optional bonding layer 406 can be added, if eutectic metal bonding between the chip 402 and the layer 408 is desired. In this case, the exposed nanotube ends protrude into this layer and may extend through it. Preferably, the bonding layer 406 is a eutectic metal, but thermal polymer based bonding compounds may also be used. The layer 412 is an interface material which can be used with a silicon heat sink body 404. Typically, the layer 412 is composed of silicon nitride compounds. For metal heat sink bodies 404, the layer 412 is optional and is only required to aid in the adhesion of the catalyst metal layer 410. The metal catalyst layer 410 is used to initiate and control growth of the nanotubes in the layer 408. The metal catalyst layer 410 may chosen from among Ti, Co, Cr, Pt, Ni, and their alloys. Preferably, the metal catalyst layer 410 comprises Ni and Ni alloys. Further process conditions related to these layers are discussed below.

Figure 5:
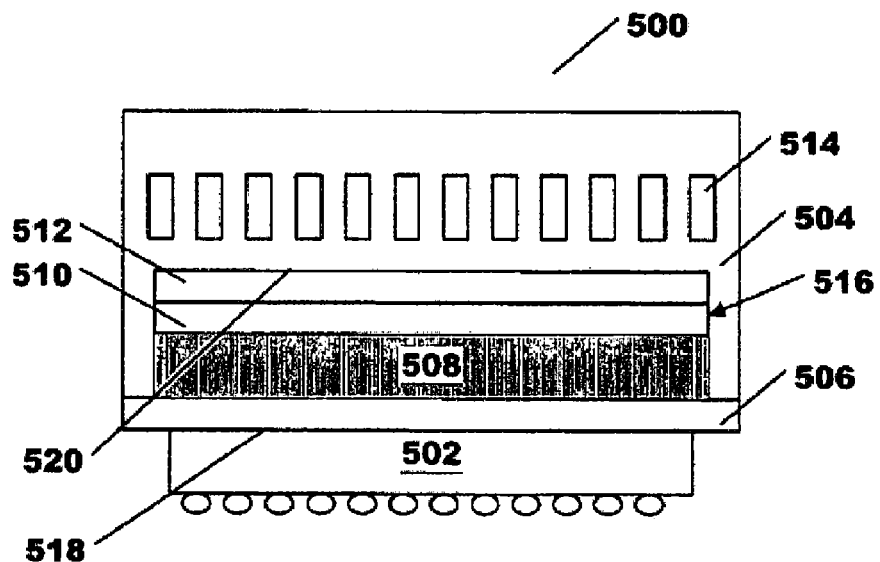
FIG. 5 is a cross section schematic view of an integrated micro-cooler device having internal flow channels according to the invention.

FIG. 5 is a cross section schematic view of an integrated micro-cooler device 500 having internal flow channels 514 according to an embodiment of the invention. The device 500 comprises a heat sink body 504 for extracting thermal energy from the surface 518 of a flip chip 502. Heat energy is delivered to the heat sink surface 520 by an enhanced heat transfer interface structure containing layers 508, 510, and 512. Layers 508, 510, and 512 reside in a heat spreading cavity 516 fashioned in a body 504. In this embodiment, the heat sink body 504 contains enclosed flow passages 514 that remove the thermal energy transferred from the chip 502. Both liquid and gas cooling is possible but, for this embodiment, liquid cooling is preferred due to the specific heat capacity of a liquid coolant, such as water. A refrigerant may also be used in very high heat removal systems, or where sub-ambient junction temperatures are required for very high speed processors. Due to the high heat fluxes encountered by such systems, the low thermal resistances provided by embodiments of the invention become essential to reliable operation. The layers 506, 508, 510, and 512 have the same function and are composed of the same materials as described above for corresponding layers 406, 408, 410, and 412.

Figure 6:
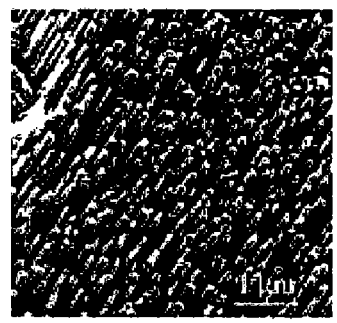
FIG. 6 is an electron microscope photo of carbon nanotubes according to the invention.

FIG. 6 is an electron microscope photo of carbon nanotubes according to an embodiment of the invention. In this figure, the aligned, individually separated, parallel nature of the MWCNTs is evident. Also evident are the interstitial voids between nanotubes that need to be filled for good lateral heat conduction.

Figure 7:
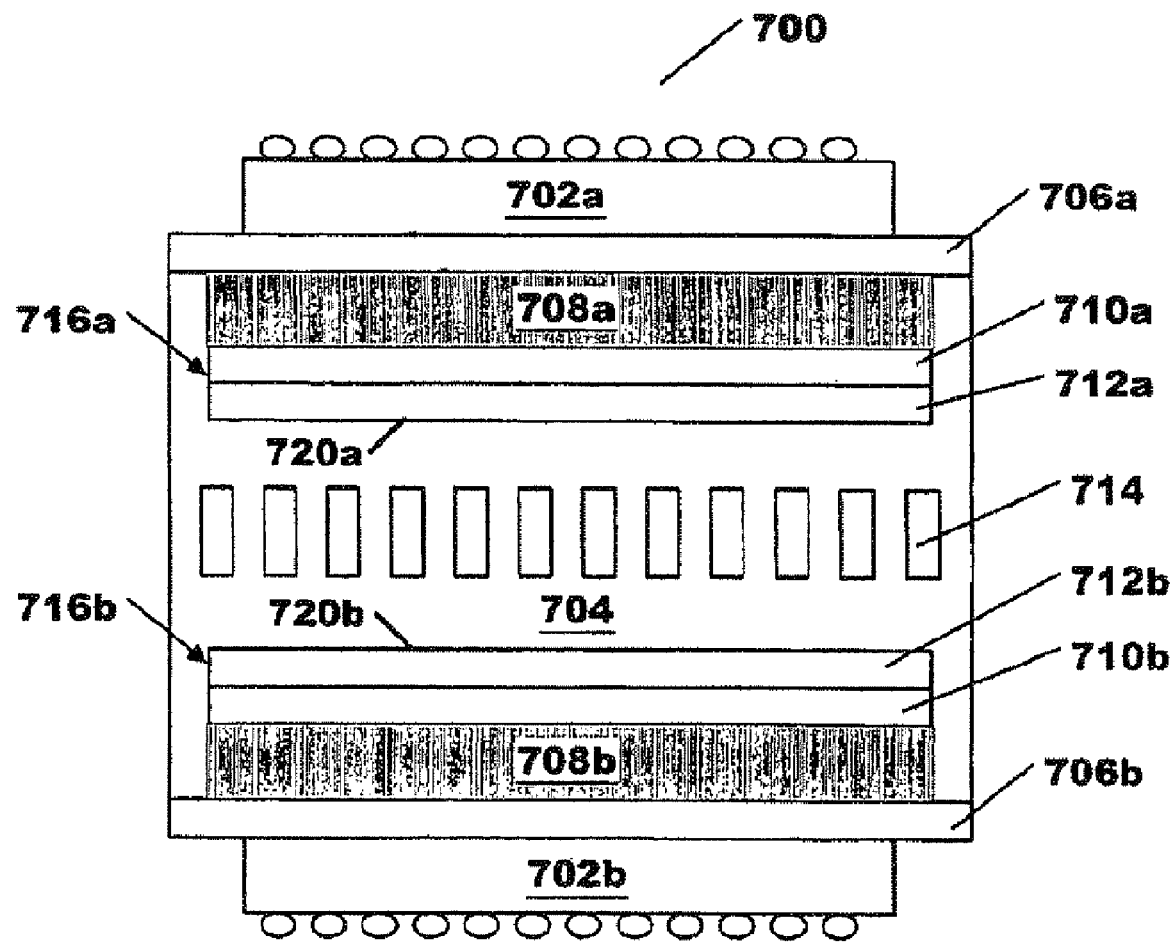
FIG. 7 is a cross section schematic view of an integrated micro-cooler device bonded to multiple flip chip integrated circuits according to the invention.

FIG. 7 is a cross section schematic view of an integrated micro-cooler device 700 attached to multiple flip chip integrated circuits according to an embodiment of the invention. The device 700 comprises a heat sink body 704 for extracting thermal energy from heat generating multiple flip chips 702a and 702b. Heat energy is delivered to the heat sink surfaces 720a and 720b by an enhanced heat transfer interface structure containing layers 508a, 510a and 512a, and 508b, 510b and 512b. The layers 508a, 510a and 512a, and 508b, 510b and 512b, reside in heat spreading cavities 716a and 716b, respectively. In this embodiment, the heat sink body 704 contains enclosed flow passages 714 that remove the thermal energy transferred from the chip 502. For this embodiment, due to the increased heat loading, liquid cooling is preferred due to the specific heat capacity of a liquid coolant such as water. A refrigerant may also be used for removal of the high heat loads, or where sub ambient junction temperatures are required for very high speed processors. The layers 706a, 708a, 710a and 712a, and 706b, 708b, 710b and 712b, have the same function and are composed of the same materials as described above for corresponding layers 406, 408, 410, and 412.

Figure 8:
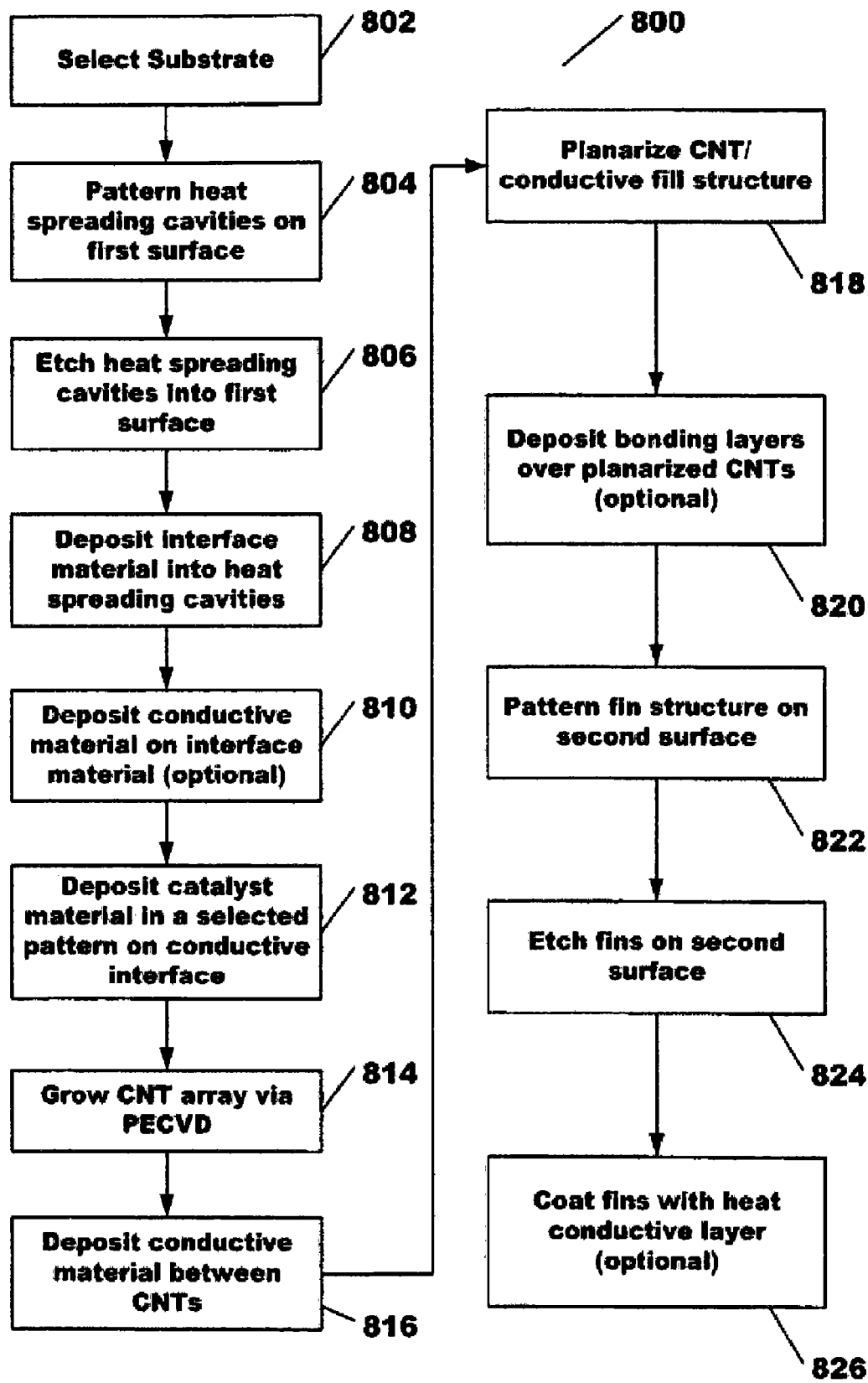
FIG. 8 is a process flow diagram illustrating the steps for manufacture of a finned integrated micro-cooler device according to the invention.

FIG. 8 is a process flow diagram 800 illustrating exemplary steps for manufacture of a finned integrated micro-cooler device according to an embodiment of the invention. At step 802, a suitable material is selected for the substrate or heat sink body, e.g. 404. The subsequent steps refer to a process where silicon is chosen as the substrate. At step 804, heat spreading cavities, e.g. 416, are patterned in a first (or bottom) surface. At step 806, the heat spreading cavities are etched, and at step 808, an interface material, e.g. 412 is deposited in the cavities e.g. 416. As previously mentioned, this interface material is silicon nitride in some embodiments. Numerous techniques are known to those skilled in the art to deposit silicon nitride, examples of which are CVD, or sputtering. Alternatively, the heat spreading cavities can be fabricated by machining if the heat sink body material is chosen to be a metal or ceramic. At step 810, an optional conductive layer is deposited over the interface layer to facilitate the deposition and adhesion of the subsequent catalyst layer. The conductive layer is preferably composed of Ti, Cr, or Pt with thickness in the range of 3 nm-200 nm. If the heat sink body is metal, a conductive layer may not be required. At step 812, a catalyst material chosen from among Ti, Co, Cr, Pt, Ni, and their alloys is deposited using CVD, PVD, electroplating or electroless deposition to a layer thickness of 3 nm to 30 nm. At step 814, a carbon nanotube array e.g. as part of layer 408 of individually separated carbon nanotubes is grown. In some embodiments, the array is grown via PECVD per the method of J. Li and A. Delzeit referenced previously. At step 816, a thermally conductive material is deposited between the carbon nanotubes. For a thermally conductive material that is a metal, the material is typically deposited by electrochemical deposition or CVD, as is known to those skilled in the art. If a CVD diamond interstitial material is used, CVD processes known in the art can be used. At step 818, the carbon nanotube containing layer e.g. 408 is planarized by CMP, electrochemical etching, or a combination of both. At step 820, an optional eutectic bonding layer e.g. 406, of appropriate thickness is added if desired. At step 822, fins, e.g. 414 are patterned in a second (or top) surface for silicon substrates. At step 824, the fins are etched by well known methods. At step 826, the fins are coated with an optional metal coating or CVD diamond, deposited at the appropriate thickness required to minimize temperature gradients along the fins' surfaces. For the case of a metal heat sink body, e.g. 404, the fins are fabricated by well known machining processes.

Figure 9:
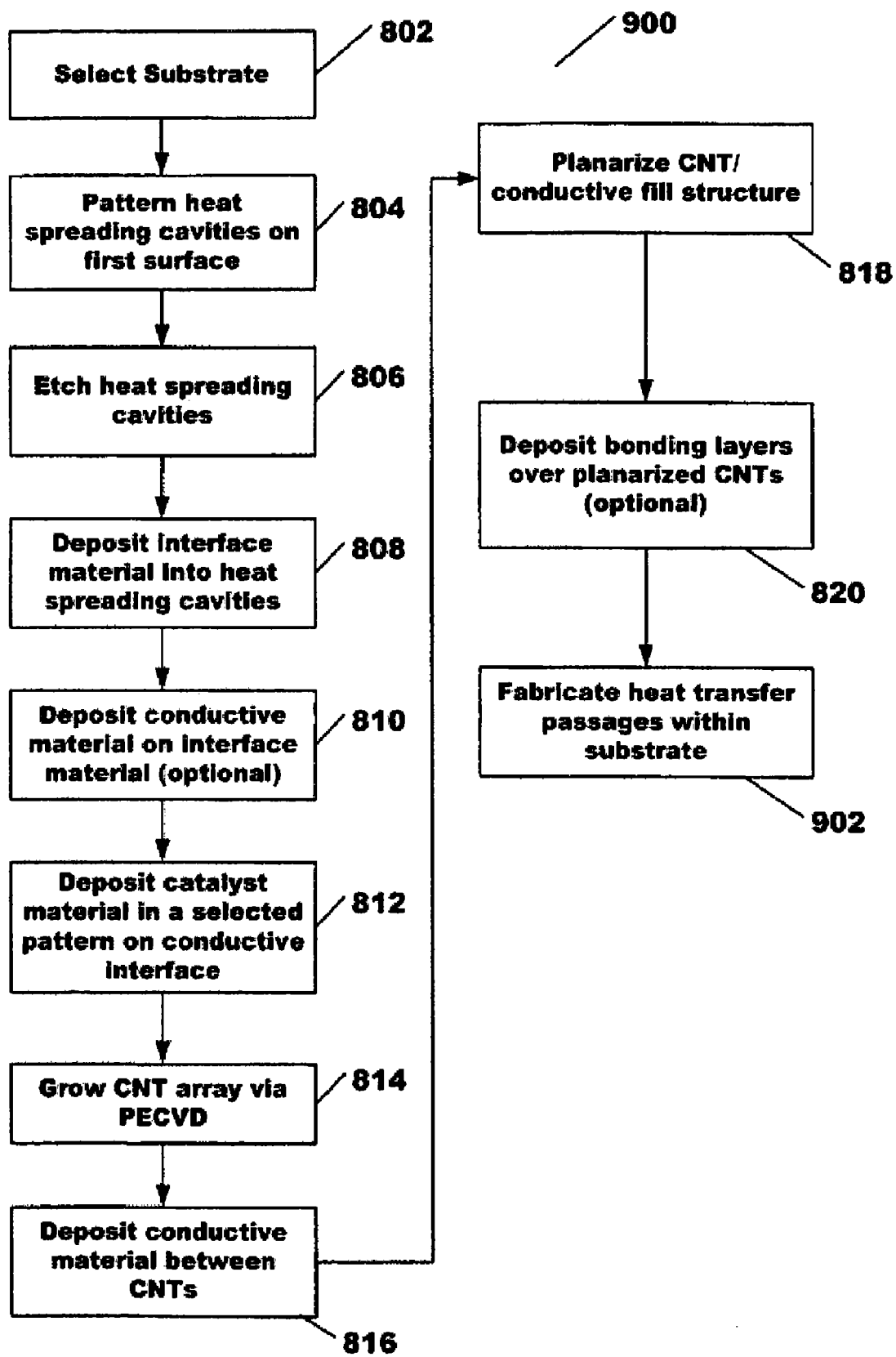
FIG. 9 is a process flow diagram illustrating the steps for manufacture of an integrated micro-cooler device having internal flow channels according to the invention.

FIG. 9 is a process flow diagram 900 illustrating exemplary steps for manufacture of an integrated micro-cooler device having internal flow channels according to an embodiment of the invention. At step 902, the flow passages, e.g. 514 are fabricated in the heat transfer body, e.g. 504. For metal bodies, standard machining techniques can be used. For silicon substrates, fins may be fabricated as described in the embodiments shown in FIG. 8. A suitable metal, ceramic, or silicon plate or cover is adhesively bonded to the top, flat surfaces of the fins to create enclosed passages, e.g. 514.

Figure 10:
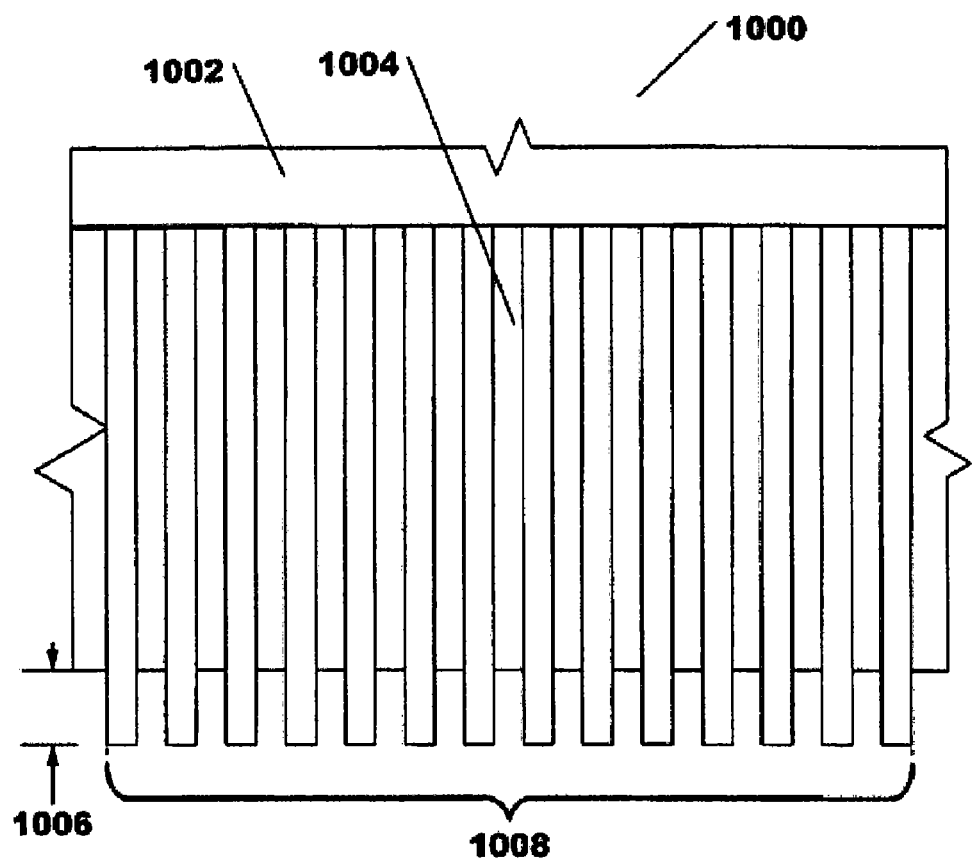
FIG. 10 is a partial cross section view of the nano-structure array subsequent to a planarization process according to the invention.

FIG. 10 is a partial cross section view 1000 of the nanostructure array subsequent to a planarization process according to an embodiment of the invention. Carbon nanotubes or nanowires 1008 are grown from the metal/catalyst layer 1002 in an approximately parallel structure as shown. As previously described, a thermally conductive filler material 1004 is placed in the voids between the nano-structures 1008. Planarization of the nano-structures produces a gap 1006 between the ends of the nano-structures and the recessed planarized surface of the filler material. Gap 1006 results from a chemical-mechanical planarization (CMP) process when a composite material containing components of significantly different hardness is planarized. In the case where the nano-structures are MWCNTs and the filler is a metal such as copper, aluminum, or silver, the planarization process undercuts the filler because the metal is much softer than the carbon nanotubes. The same effect can be created by chemical or electrochemical etching of the filler metal because base metals, such as copper, are more reactive and susceptible to chemical dissolution than the relatively chemically inert carbon nanotubes.

Figure 11:
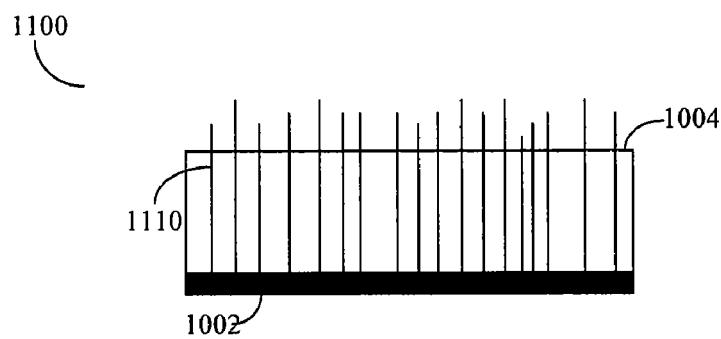
FIG. 11 is a schematic cross-section of an apparatus, where the edges of the carbon nanotubes are exposed over the surface of the filler material according to the invention.

The unsupported nano-structures in the gap 1006 are relatively flexible, allowing the exposed ends to twist and bend on a micron scale to conform to undulations and imperfections in the heat generating surface of the integrated circuit chip. This hair brush effect produces intimate contact with the ends of the nano-structures, allowing heat extraction along the axis of the nanotubes, where their thermal conductivity is the greatest. If a eutectic or bonding layer is used, the exposed ends of the nano-structures protrude into this layer, and are allowed to conform to the opposing surface when the eutectic or bonding layer is fluid, as would occur prior to bonding the two surfaces. The expected gap dimension 1006 depends on the surface flatness of the circuit, silicon die and of the planarized micro-cooler surface. The RMS value of the surface asperity is believed to lie in the range of 0.2 um to 3 um with preferred values being at the lower end of the range. Therefore, in an embodiment of the invention and as further seen in cross section 1100 of FIG. 11, the carbon nanotubes 1110 growing from substrate 1002 protrude over the surface of the filler material 1004 at different lengths. The carbon nanotubes are generally grown in the desired heat transfer axis to enable a thermal interface from a hot spot. To overcome the potential reduction of the thermal conductivity between a micro-cooler and a heat sink the following steps are disclosed.

Figure 12:
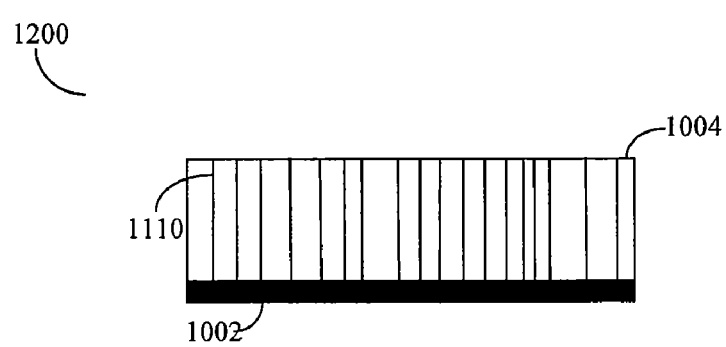
FIG. 12 is a schematic cross-section of the disclosed apparatus showing the carbon nanotubes cut to uniform length over the surface of the filler material according to the invention.

FIG. 12 shows a schematic cross-section 1200 of the disclosed apparatus or micro-cooler, with the carbon nanotubes 1110 cut to uniform length over the surface of the filler material 1004. The filler material includes, but is not limited to, copper and copper alloys. Other non-metallic filler material that wet CNT arrays and get sucked by capillary forces into the air interspace interstial to nanotubes are:

a) wax-paraffin;
   b) polymers with low viscosity e.g. <200 centipoise, and/or, with low Young's module e.g. <1 psi;
   c) any other low Young's module material e.g. silicone gel, seeded with nano-particles e.g. silver, with diameters much smaller than the spacing of the individually separated and relatively parallel nanotubes.

It is important that the carbon nanotubes or nanofibers are individually separated and parallel before or as a result of the embedding of the filler material. Spin coating is used to accomplish the same result as capillary forces. In accordance with the invention, the exposed carbon nanotubes 1110 are cut closely to the surface of the filler material 1004 using various methods. Cutting methods include, but are not limited to, oxidation where oxygen is used to burn the exposed carbon nanotubes, while the buried part of the carbon nanotubes is protected by the filler material 1004. Another cutting method is mechanical polishing, where the carbon nanotubes are mechanically removed back to the surface of the filler material. Yet another cutting method uses chemical etching where the carbon nanotubes are chemically removed above the surface of the filler material.

Figure 13:
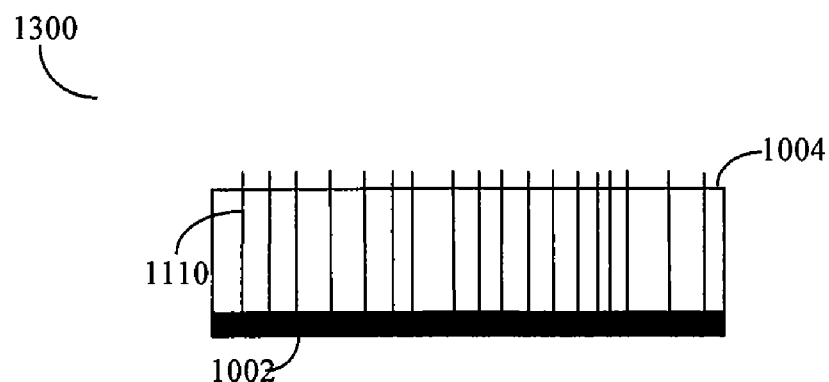
FIG. 13 is a schematic cross-section of the disclosed apparatus showing the carbon nanotubes of uniform length over a partially removed filler material according to the invention.

FIG. 13, shows schematic cross-section 1300 of the apparatus, where the carbon nanotubes 1110 are of uniform length over a partially removed filler material 1004. After the cutting the carbon nanotubes 1110 to essentially the level of the filler material 1004 surface, the surface of the filler material 1004 is partially removed using a selective removal process, thereby exposing the edges or ends of the carbon nanotubes 1110. As a result, the edges of the carbon nanotubes 130 of the apparatus protrude above the surface of the filler material 1004 at essentially the same length, thereby providing the advantages sought by the invention. The apparatus thus provides a thermal interface structure that enables an effective thermal path between a hot surface and a cooling surface.

Figure 14:
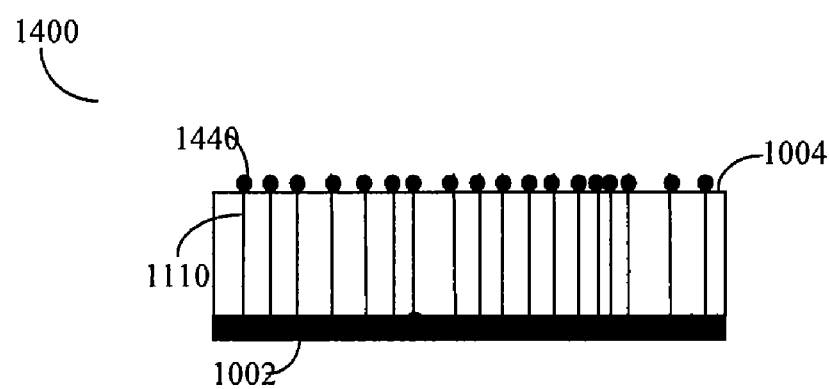
FIG. 14 is a schematic cross-section of the disclosed apparatus with carbon nanotube growth nuclei deposited on the uniform length exposed edges of the carbon nanotubes according to the invention.
Figure 15:
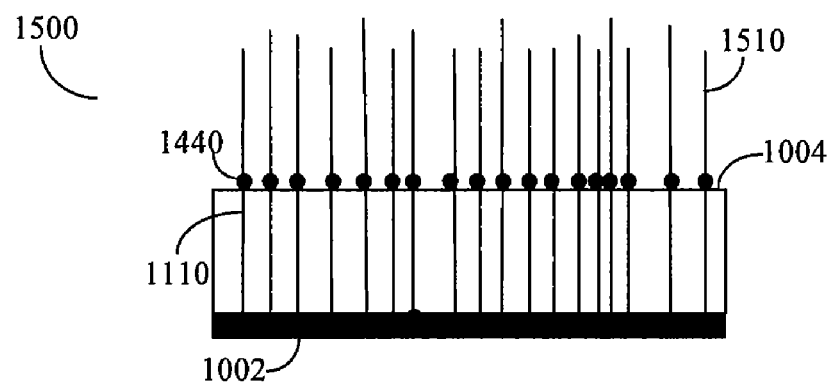
FIG. 15 is a schematic cross-section of the disclosed apparatus with carbon nanotubes growing from the CNT growth nuclei extending the length of the lower layer carbon nanotubes according to the invention.

FIG. 14 shows a cross section 1400 of the apparatus with a nucleus 1440 for carbon nanotube growth placed essentially on top of the tips of the exposed carbon nanotubes. These sites are used, as is shown with reference to FIG. 15, to grown the carbon nanotubes 1510 in a continuum to the previously grown carbon nanotubes 1110, effectively creating longer carbon nanotubes. The carbon nanotubes 1510 may vary in length, as shown in cross section 1500, similar in nature to the various length of carbon nanotubes 1110 described in more detail above. In the embodiment where the carbon nanotubes are not exposed above the surface of filer material 1004, the nucleus carbon nanotube for carbon nanotube growth may be placed at sites on the surface at a density that corresponds to the required coverage of carbon nanotubes.

Figure 16:
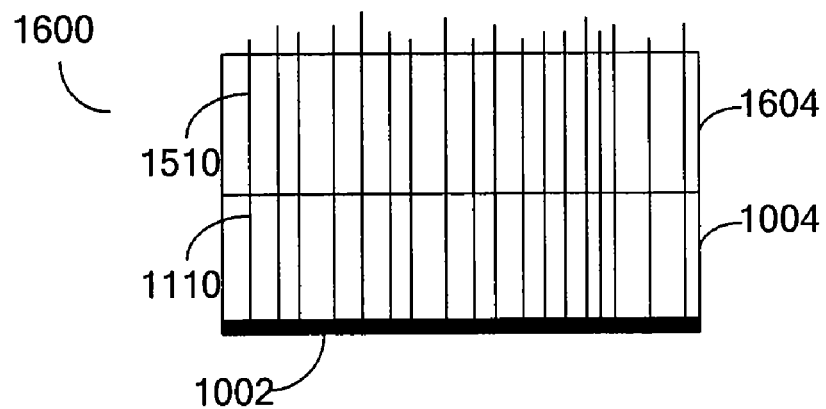
FIG. 16 is a schematic cross-section of the disclosed apparatus showing the next layer of carbon nanotubes in a supporting medium according to the invention.

FIG. 16, shows a schematic cross-section 1600 of the apparatus, where a plurality of carbon nanotubes 1510, are grown by extending a prior plurality of carbon nanotubes 1110 over the surface of prior filler material 1004, embedded in a filler material 1604. Typically, and as can be further seen in FIG. 11, the carbon nanotubes 1510 grow in varying lengths and hence protrude over the surface by varying lengths. In one embodiment of the invention, after the ECD step the carbon nanotubes 1510 are completely covered by the filler material 1604, the filler material being, but not limted to, copper or a copper alloy, silver, aluminum, phase-shift materials, waxparffin, polymer, or silicone gel. In one embodiment of the invention different layers comprise different filler materials., The layers are bonded to each other using techniques suitable to the interface bond appropriate to each. Therefore, in one embodiment a step to ensure proper adhesion and/or bonding between the filler material 1604 and the filler material 1004 is performed. The filler material 1604 may be selectively removed to expose the edges of the carbon nanotubes, as shown in cross section 1600.

Figure 17:
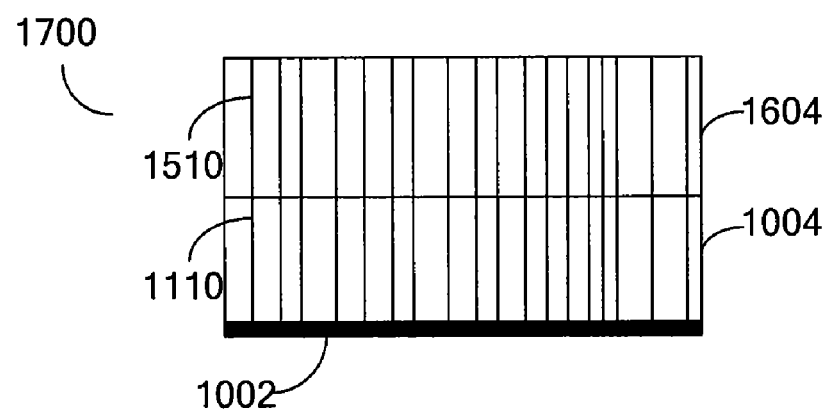
FIG. 17 is a schematic cross-section of the disclosed apparatus showing the carbon nanotubes of the second layer cut to length over the surface of the second layer supporting medium according to the invention.

FIG. 17 shows a schematic cross-section 1700 of the disclosed apparatus, with the carbon nanotubes 1510 cut to uniform length over the surface of the filler material 1604. The carbon nanotubes are cut, for example, in the methods described in a U.S. patent entitled An Integrated Circuit Micro-Cooler with the Tubes of a CNT Array in Essentially the Same Height Over a Surface and Methods Thereof and assigned to common assignee. Hence, in accordance with the disclosed invention the exposed carbon nanotubes 1510 are cut closely to the surface of the filler material 1604 using various methods described above.

Figure 18:
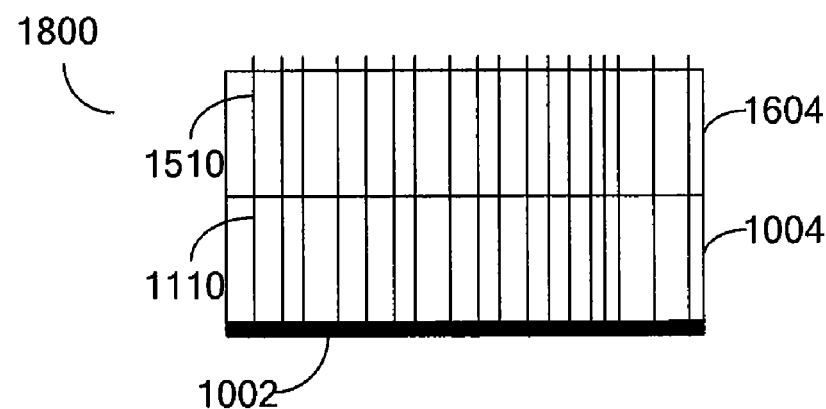
FIG. 18 is a schematic cross-section of the disclosed apparatus showing a second layer of carbon nanotubes of uniform length over a partially removed support medium according to the invention.

FIG. 18 shows a schematic cross-section 1800 of the disclosed apparatus, where the carbon nanotubes 1510 are of uniform length over a partially removed filler material 1604. After cutting the carbon nanotubes 1510 to essentially the level of the filler material 1604 surface, the surface of the filler material 1604 is partially removed using a selective removal process, thereby exposing the edges of the carbon nanotubes 1510. As a result, the edges of the carbon nanotubes 1510 of the apparatus protrude above the surface of the filler material 1604 at essentially the same length, thereby providing the advantages sought by the disclosed invention. The exposed edges may be used for the nuclei sites for additional growth of the next layer of carbon nanotubes, or allow for the desired heat transfer interface medium. The apparatus thus provides a thermal interface structure that enables an effective thermal path between a hot surface and a cooling surface.

The steps shown in FIGS. 14 through 18 are repeated for each additional layer of carbon nanotubes. The repetition continues until the desired lengths of carbon nanotubes, or desired thickness of the apparatus is achieved. In one embodiment of the invention, the substrate 1002 is removed to enable exposure of the edges of the carbon nanotubes of the opposite surface of the apparatus, thereby enabling a double-sided multi-layer apparatus. The techniques for this are disclosed in a U.S. patent application entitled An Integrated Circuit Micro-Cooler with Double-Sided Tubes of a CNT Array and Methods Thereof assigned to common assignee, and which is hereby incorporated by reference for all the it contains.

Figure 19:
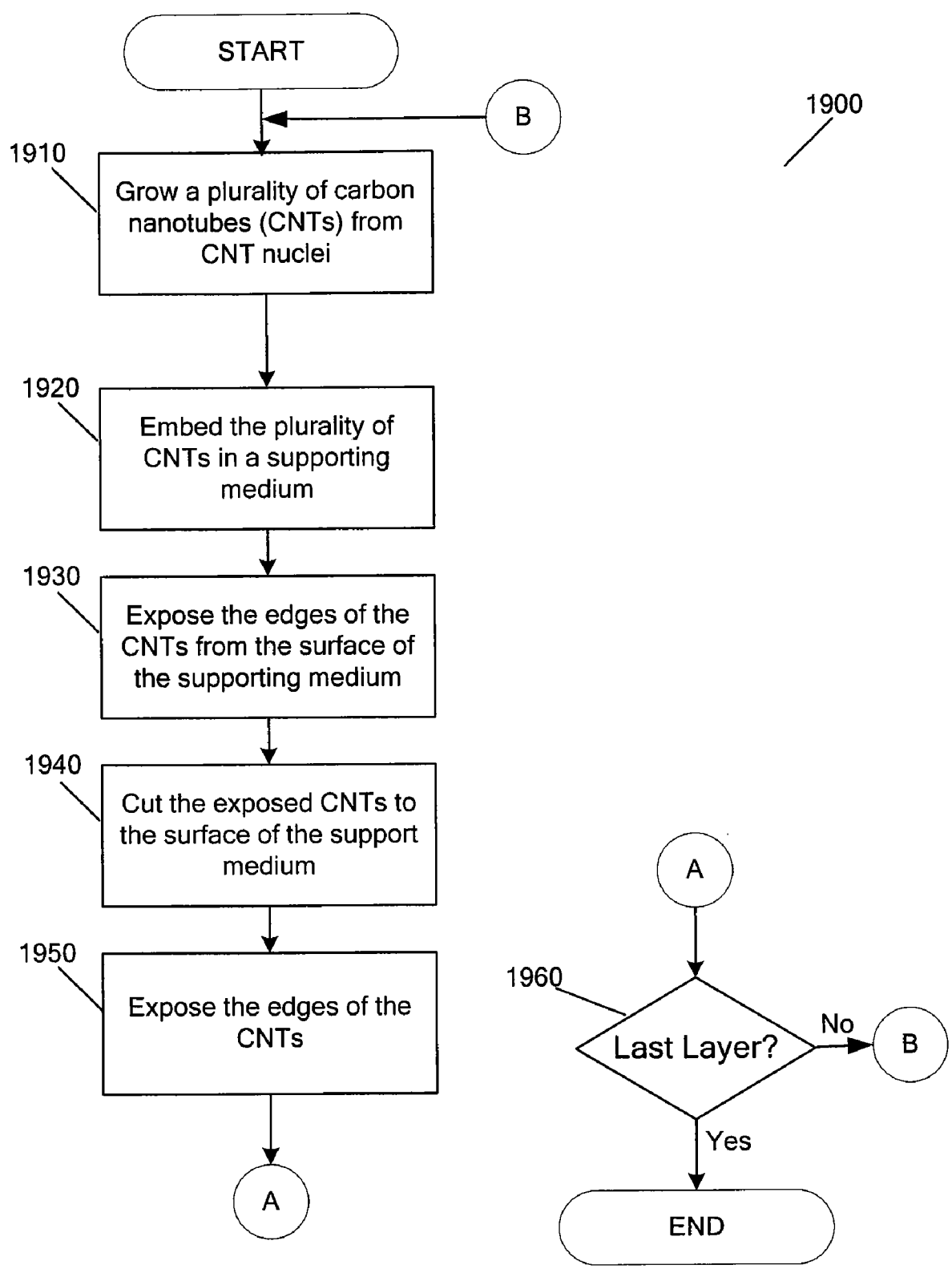
FIG. 19 is a flowchart diagram of the process of growing multiple layers of carbon nanotubes according to the invention.

FIG. 19 is a flowchart 1900 showing the method for creating carbon nanotubes of essentially equal length. In step 1910, a plurality of carbon nanotubes are grown from a nuclei, the nuclei being placed for example on a silicon wafer or copper, or from the edge of another nuclei site, using methods that are well known in the art. In step 1920, the plurality of carbon nanotubes are embedded in a filler material such as, but not limited to, electro-chemically-deposited (ECD) copper, forming, for example, the filler material 1004 or a filler material 1604. In step 1930, the edges of the carbon nanotubes are exposed using methods well known in the art, such as electrochemical polishing (ECP) chemical-mechanical polishing (CMP), or plasma etching of the excess material and or of the nanotube ends. Specifically, the method comprises the steps of immersing the nanotubes in the filler material, preferably in a soft, semi-liquid form, then allowing for solidification of the filler material at lower temperature followed by etching excess filler material and the nanotubes edges to provide smooth nanotubes and a filler material surface having roughness of less than 100 nanometers peak-to-peak. In the case where the filler material is made of wax-paraffin or a phase change material, the surface smoothness is obtained from pressing the edges of the surface of the filler material against another flat surface, e.g. glass or copper plate, while heating the structure to above its melting point, followed by cooling the structure so that the filler material enters its solid phase.

In step 1940, the edges of the carbon nanotubes are cut to substantially the same length over the surface of the supporting medium, for example, filler material 1004 or a filler material 1604. Cutting methods include, but are not limited to, oxidation where oxygen is used to burn the exposed carbon nanotubes while the buried part of the carbon nanotubes is protected by the support medium, for example, filler material 1004 or a filler material 1604. In step 1950, the edges of the carbon nanotubes are exposed by selectively removing a portion of the surface of the support medium, for example, filler material 1004 or filler material 1604, using a selective removal process. Such a process removes the support medium but leave the carbon nanotubes that are of a different material generally intact, thereby exposing the edges of the carbon nanotubes from the surface of the support medium. In step 1960, if another layer is to be grown, the flow proceeds to step

1910 where the process of adding another carbon nanotube layer begins. Otherwise, the process of making a multi-layer carbon nanotube array is complete. The end result is a heat conductor comprised of multiple layers of carbon nanotubes that are embedded in a support medium where the carbon nanotubes protrude essentially the same length above the surface of the support medium.

In one embodiment of the method, removal of the substrate enabling the initial growth of the carbon nanotubes is performed. The edges may be cut to achieve similar results to those disclosed in a U.S. patent application entitled A Method for Making a Double-Sided CNT Structure assigned to common assignee, and which is incorporated herein by reference for all that it contains. In one embodiment of the invention the carbon nanotubes protruding from one surface are longer than the carbon nanotubes protruding from the opposite surface.

The various embodiments described above should be considered as merely illustrative of the invention. They are not intended to be exhaustive or to limit the invention to the forms disclosed. Those skilled in the art will readily appreciate that still other variations and modifications may be practiced without departing from the general spirit of the invention set forth herein. Therefore, it is intended that the present invention be defined by the Claims that follow.

The invention claimed is:

1. A micro-cooler device structure comprising:
a heat sink body having a heat sink surface;
at least one integrated circuit chip having at least one integrated circuit chip surface; and
a multi-layer structure, each layer of said multilayer structure comprising a plurality of individually separated, rod-like nano-structures for transferring thermal energy from a surface of at least one integrated circuit chip to said heat sink surface, said plurality of individually separated, rod-like nano-structures being disposed between said heat sink surface and said surface of at least one integrated circuit chip; wherein
a thermally conductive material is disposed within interstitial voids between said plurality of individually separated, rod-like nano-structures, and wherein the rod-like nano-structures of each layer of said multilayer structure form a continuum between the layers of the multi-layer structure.

2. A micro-cooler device as recited in claim 1, wherein said plurality of individually separated, rod-like nano-structures comprise multi-walled carbon nanotubes.

3. A micro-cooler device as recited in claim 1, wherein said plurality of individually separated, rod-like nano-structures comprise metallic nano-wires.

4. A micro-cooler device as recited in claim 3, wherein said metallic nano-wires are oriented substantially perpendicular to said surface of at least one integrated circuit chip.

5. A micro-cooler device as recited in claim 1, wherein said thermally conductive material comprises any of copper, alloys of copper, silver, aluminum, phase change material, polymer, and silicone gel.

6. A micro-cooler device as recited in claim 1, wherein said heat sink body is cooled by any of fins and a liquid flowing through passages fashioned therein.

7. A micro-cooler device as recited in claim 1, wherein said plurality of individually separated, rod like nano-structures have a surface coverage density between 15 and 40 percent.

8. A micro-cooler device as recited in claim 1, wherein the edges of said rod like nano-structures protrude a substantially identical length from said micro-cooler device surface.

* * * * *